United States Patent [19]
Saito

[11] Patent Number: 5,883,527
[45] Date of Patent: Mar. 16, 1999

[54] TRI-STATE OUTPUT CIRCUIT FOR SEMICONDUCTOR DEVICE

[75] Inventor: Teruhiko Saito, Kasugai, Japan

[73] Assignee: Fujitsu Limited, Kawasaki, Japan

[21] Appl. No.: 789,797

[22] Filed: Jan. 28, 1997

[30] Foreign Application Priority Data

Jan. 29, 1996 [JP] Japan .................................... 8-013220

[51] Int. Cl.$^6$ .............................................. H03K 17/16
[52] U.S. Cl. ................................................ 326/58; 326/83
[58] Field of Search .................. 326/58, 57, 83, 326/87

[56] References Cited

U.S. PATENT DOCUMENTS

| | | | |
|---|---|---|---|
| 4,885,480 | 12/1989 | Faris et al. | 326/83 |
| 5,051,625 | 9/1991 | Ikeda et al. | 326/83 |
| 5,506,522 | 4/1996 | Lee | 326/58 |
| 5,565,796 | 10/1996 | Nakase | 326/83 |
| 5,773,999 | 6/1998 | Park et al. | 326/83 |

*Primary Examiner*—Michael Tokar
*Assistant Examiner*—Richard Roseen
*Attorney, Agent, or Firm*—Nikaido, Marmelstein, Murray & Oram LLP

[57] ABSTRACT

An output circuit for a semiconductor device that offers improved reliability of data transfer over long distance as well as low consumption. In one embodiment, an output circuit according to the invention includes: an output circuit section having a pair of output terminals for outputting complementary output signals in response to an input signal received by the output circuit section, and a switch circuit connected between the pair of output terminals of the output circuit section. The output circuit section sets the pair of output terminals in a high-impedance state in response to a high-impedance setting signal received by the output circuit section. The switch circuit causes electric coupling between the pair of output terminals in response to the high-impedance setting signal.

17 Claims, 6 Drawing Sheets

5,883,527

TRI-STATE OUTPUT CIRCUIT FOR SEMICONDUCTOR DEVICE

BACKGROUND OF THE INVENTION

1. Field of the Invention

The present invention relates generally to an output circuit for a semiconductor device. More particularly, the invention relates to an output circuit suitable for use in a data communications system.

2. Description of the Related Art

In a bus-based data communications system, it is important to lengthen the data transfer distance and improve the reliability of data transfer. Therefore, in output circuits of semiconductor devices which are used in such a data communications system, ensured reliability of data, longer transfer capability and lower consumed power are demanded.

FIG. 1 is a circuit diagram showing a conventional 3-value output circuit for a semiconductor device that outputs three values of "+1", "0" and "−1". The output data "−1" is obtained, for example, in the following manner. As NOR gate 1a, NAND gate 2a, inverter circuits 3b, 3c and 3d, and transistors Tr1 and Tr2 operate in response to a L-level high-impedance setting signal Z and a H-level input signal IN, a L-level output signal OUTP is output from an output terminal $T_{O1}$. As NOR gate 1b, NAND gate 2b, inverter circuits 3a, 3e and 3f, and transistors Tr3 and Tr4 operate in response to the L-level high-impedance setting signal Z and the H-level input signal IN, a H-level output signal OUTM is output from an output terminal $T_{O2}$. The output data "−1" is acquired from the L-level level output signal OUTP and the H-level output signal OUTM.

The output data "+1" is acquired from a H-level output signal OUTP and a L-level output signal OUTM, which are output when the aforementioned individual circuits operate in response to the L-level high-impedance setting signal Z and a L-level input signal IN.

The output data "0" is obtained as follows. When the high-impedance setting signal Z is set to the H-level, the transistors Tr1, Tr2, Tr3 and Tr4 are turned off regardless of the level of the input signal IN. As a result, the output signals OUTP and OUTM are both rendered in the high-impedance state, thus yielding the output data "0".

When the output signals OUTP and OUTM are both in the high-impedance state, the voltages on transfer lines L1 and L2 which are respectively connected to the output terminals $T_{O1}$ and $T_{O2}$ become unstable. During the transition of the levels of the voltages on transfer lines L1 and L2 from the H-level or L-level to an intermediate level, therefore, noise N such as undershoot or overshoot as shown in FIG. 2 is likely to appear on the output signal. Such noise N may lead to the transfer of erroneous data to a receiving apparatus connected to the transfer lines L1 and L2 (see FIG. 1). This noise N can be reduced by providing a terminating resistor R having a relatively low resistance between the transfer lines L1 and L2. This terminating resistor R however lowers the rising and falling speeds of the output signals OUTP and OUTM. Further, the amplitudes of the output signals OUTP and OUTM become lower and thus reduces the reliability of data transferred using the long transfer lines L1 and L2. Also, the use of the transistors Tr1 to Tr4 having an enhanced current drive performances to acquire an output signal with a sufficient amplitude results in the undesirable increase in the current that flows across the terminating resistor R. Consequently, the terminating resistor R increases the power consumption of the output circuit.

SUMMARY OF THE INVENTION

Broadly speaking, the present invention relates to an output circuit for a semiconductor device has improved reliability of data transfer over long distance as well as low power consumption. The present invention can be implemented in numerous ways including as an apparatus and a method. Several implementations of the invention are described as follows.

An output circuit, an embodiment of the invention includes: an output circuit section having a pair of output terminals for outputting complementary output signals in response to an input signal received by the output circuit section, and a switch circuit connected between the pair of output terminals of the output circuit section. The output circuit section sets the pair of output terminals in a high-impedance state in response to a high-impedance setting signal received by the output circuit section. The switch circuit causes electric coupling between the pair of output terminals in response to the high-impedance setting signal. The output circuit according to another embodiment may further includes a limiting circuit for limiting a time during which the pair of output terminals are electrically coupled by switch circuit.

Other aspects and advantages of the invention will become apparent from the following description, taken in conjunction with the accompanying drawings, illustrating by way of example the principals of the invention.

BRIEF DESCRIPTION OF THE DRAWINGS

The invention and advantages thereof, may best be understood by reference to the following description of the presently preferred embodiments together with the accompanying drawings in which.

DETAILED DESCRIPTION OF THE PREFERRED EMBODIMENTS

Figure 1:
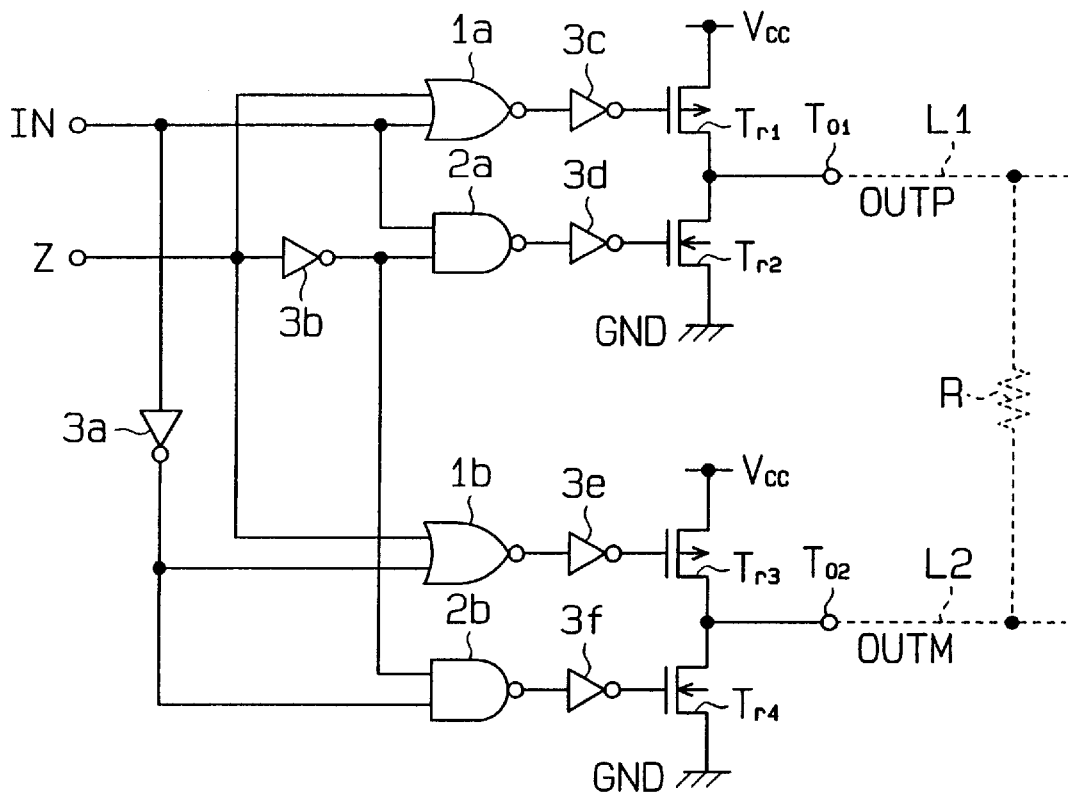
FIG. 1 is a circuit diagram illustrating a conventional output circuit of a semiconductor device.
Figure 2:
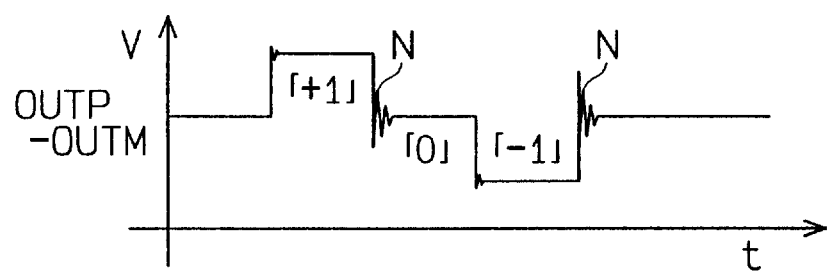
FIG. 2 is a waveform diagram showing an output signal output from a conventional output circuit such as the conventional output circuit illustrated in FIG. 1.
Figure 3:
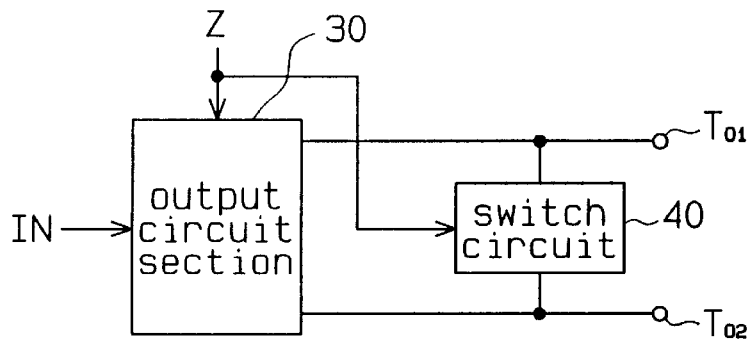
FIG. 3 is a block diagram illustrating an output circuit for a semiconductor device according to a basic embodiment of the invention.

FIG. 3 presents a block diagram illustrating an output circuit according to a basic embodiment of the present invention. The output circuit includes an output circuit section 30 and a switch circuit 40. The output circuit section 30 outputs complementary signals to a pair of output terminals $T_{O1}$ and $T_{O2}$ in response to an input signal IN, and sets the output terminals $T_{O1}$ and $T_{O2}$ in the high-impedance state in response to a high-impedance setting signal Z. The switch circuit 40, provided between the output terminals $T_{O1}$ and $T_{O2}$, is enabled in response to the high-impedance setting signal Z to thereby short-circuit the output terminals $T_{O1}$ and $T_{O2}$.

The switch circuit 40 may be constituted of a transfer gate. A limiting circuit for limiting the conduction time of the switch circuit 40 to a constant time in response to the high-impedance setting signal Z may be connected to the switch circuit 40. Further, the switch circuit 40, when enabled, may supply a voltage having the intermediate level of those of the complementary signals to both output terminals $T_{O1}$ and $T_{O2}$. Accordingly, the intermediate-level voltage may be supplied to both output terminals $T_{O1}$ and $T_{O2}$ while the output terminals $T_{O1}$ and $T_{O2}$ are short-circuited for a given time. The switch circuit 40 may be connected with a contention avoiding circuit which disables the switch circuit 40 in response to a contention signal indicating that other output circuits connected to the same transfer line are operating. This contention avoiding circuit disables the switch circuit 40 irrespective of whether the high-impedance setting signal Z is input to the switch circuit 40.

Figure 4:
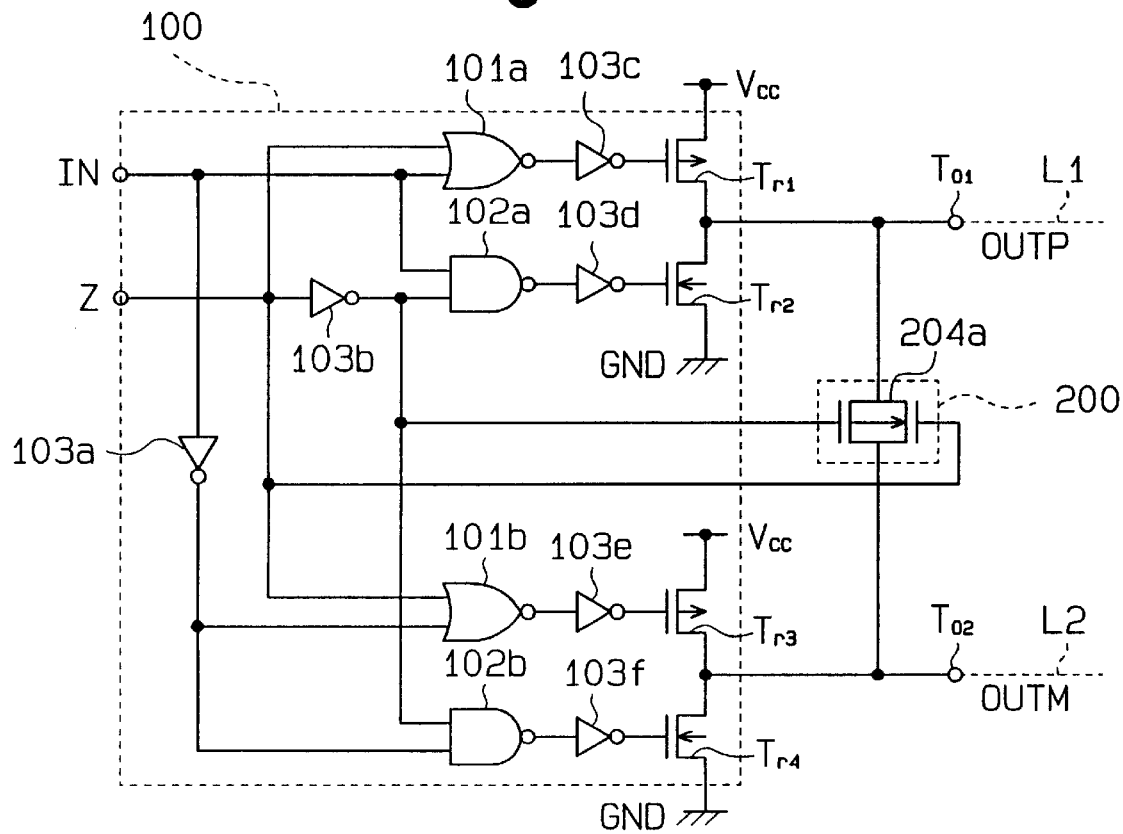
FIG. 4 is a circuit diagram illustrating an output circuit for a semiconductor device according to a first embodiment of the invention.

An output circuit for a semiconductor device according to a first embodiment of the invention will now be described with reference to the accompanying drawings. FIG. 4 is a circuit diagram illustrating the output circuit according to the first embodiment. The output circuit includes an output circuit section 100 and a switch circuit 200. The output circuit section 100 includes two NOR gates 101a and 101b, two NAND gates 102a and 102b, six inverter circuits 103a to 103f, two P-channel MOS transistors Tr1 and Tr3 and two N-channel MOS transistors Tr2 and Tr4. The switch circuit 200 is comprised of a transfer gate 204a.

The NOR gate 101a has a first input terminal for receiving an input signal IN, a second input terminal for receiving a high-impedance setting signal Z, and an output terminal. The NAND gate 102a has a first input terminal for receiving the input signal IN, a second input terminal for receiving the high-impedance setting signal Z via the inverter circuit 103b, and an output terminal. The NOR gate 101b has a first input terminal for receiving the input signal IN via the inverter circuit 103a, a second input terminal for receiving the high-impedance setting signal Z, and an output terminal. The NAND gate 102b has a first input terminal for receiving the input signal IN via the inverter circuit 103a, a second input terminal for receiving the high-impedance setting signal Z via the inverter circuit 103b, and an output terminal.

The P-channel MOS transistor Tr1 and the N-channel MOS transistor Tr2 are connected in series between a high-potential voltage supply $V_{CC}$ and ground GND as a low-potential voltage supply. The P-channel MOS transistor Tr1 has a gate connected via the inverter circuit 103c to the output terminal of the NOR gate 101a, a source connected to the voltage supply $V_{CC}$, and a drain. The N-channel MOS transistor Tr2 has a gate connected via the inverter circuit 103d to the output terminal of the NAND gate 102a, a source connected to the ground GND, and a drain connected to the drain of the transistor Tr1. The node between both transistors Tr1 and Tr2 is connected to the output terminal $T_{O1}$ from which an output signal OUTP is output.

The P-channel MOS transistor Tr3 and the N-channel MOS transistor Tr4 are connected in series between the high-potential voltage supply $V_{CC}$ and ground GND. The P-channel MOS transistor Tr3 has a gate connected via the inverter circuit 103e to the output terminal of the NOR gate 101b, a source connected to the voltage supply $V_{CC}$, and a drain. The N-channel MOS transistor Tr4 has a gate connected via the inverter circuit 103f to the output terminal of the NAND gate 102b, a source connected to the ground GND, and a drain connected to the drain of the transistor Tr3. The node between both transistors Tr3 and Tr4 is connected to the output terminal $T_{O2}$ from which an output signal OUTM is output.

Transfer lines L1 and L2 are respectively connected to the output terminals $T_{O1}$ and $T_{O2}$ between which the transfer gate 204a of the switch circuit 200 is connected. The transfer gate 204a has an N-channel side gate for receiving the high-impedance setting signal Z, and a P-channel side gate for receiving the high-impedance setting signal Z inverted by the inverter circuit 103b. The transfer gate 204a is opened or disabled in response to the L-level high-impedance setting signal Z. The transfer gate 204a is closed or enabled in response to the H-level high-impedance setting signal Z, at which time the output terminals $T_{O1}$ and $T_{O2}$ are short-circuited.

In this output circuit, output data of "−1" is obtained, for example, in the following manner. The NOR gate 101a outputs a L-level output signal in response to the L-level high-impedance setting signal Z and the H-level input signal IN. The transistor Tr1 is turned off in response to the H-level output signal supplied from the inverter circuit 103c. In response to the H-level high-impedance setting signal Z inverted by the inverter circuit 103b and the H-level input signal IN, the NAND gate 102a outputs a L-level output signal. The transistor Tr2 is turned on in response to the H-level output signal supplied from the inverter circuit 103d. As a result, the L-level output signal OUTP is output from the output terminal $T_{O1}$.

The NOR gate 101b outputs a H-level output signal at substantially the same time as the NOR gate 101a outputs the L-level output signal, and the inverter circuit 103e outputs a L-level output signal. Consequently, the transistor Tr3 is turned on. The NAND gate 102b outputs a H-level output signal and the inverter circuit 103f outputs a L-level output signal. This causes the transistor Tr4 to be turned off. As a result, a H-level output signal OUTM is output from the output terminal $T_{O2}$. The output data "−1" is acquired from the L-level output signal OUTP and the H-level output signal OUTM.

The output data "+1" is acquired from a H-level output signal OUTP and a L-level output signal OUTM, which are output when the aforementioned individual circuits operate in response to the L-level high-impedance setting signal Z and the L-level input signal IN.

The output data "0" is obtained as follows. In response to the H-level high-impedance setting signal Z, the NOR gate 101a outputs a L-level output signal regardless of the level of the input signal IN. The NAND gate 102a outputs a H-level output signal. The transistor Tr1 is turned off in response to the H-level output signal supplied from the inverter circuit 103c. The transistor Tr2 is turned off in response to the L-level output signal supplied from the inverter circuit 103d. Consequently, the output signal OUTP goes to the high-impedance state.

The NOR gate 101b outputs a L-level output signal, and the NAND gate 102b outputs a H-level output signal. The transistor Tr3 is turned off in response to the H-level output signal supplied from the inverter circuit 103e. The transistor Tr4 is turned off in response to the L-level output signal supplied from the inverter circuit 103f. Consequently, the output signal OUTM goes to the high-impedance state. The output data "0" is therefore obtained from the output signals OUTP and OUTM both in the high-impedance state.

Figure 9:
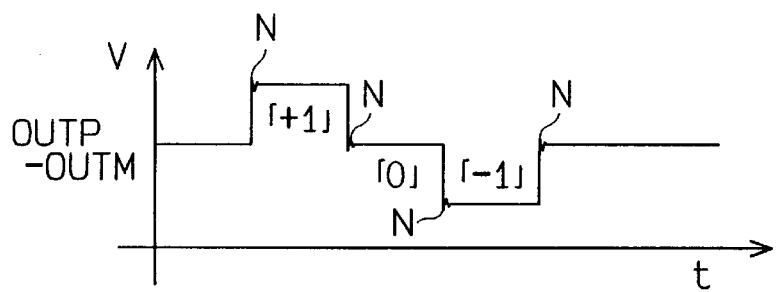
FIG. 9 is a waveform diagram showing an output signal output from the output circuit according to the first embodiment of the invention illustrated in FIG. 4.

At this time, the transfer gate 204a is enabled in response to the H-level high-impedance setting signal Z, rendering the output terminals $T_{O1}$ and $T_{O2}$ in the short-circuited state. That is, the output terminals $T_{O1}$ and $T_{O2}$ are short-circuited while the output signals OUTP and OUTM are in the high-impedance state, so that the impedance between the transfer lines L1 and L2 decreases. As a result, noise N on the output signal on the transfer lines L1 and L2 is suppressed, as shown in FIG. 9.

Since the transfer gate 204a is disabled while the L-level high-impedance setting signal Z is being output, the impedance between the transfer lines L1 and L2 does not decrease. While the H-level and L-level complementary output signals OUTP and OUTM are being output, therefore, the amplitudes of the output signals OUTP and OUTM do not become smaller. This permits the reliability of data transferred using the long transfer lines L1 and L2 to be maintained. Further, it is unnecessary to use the transistors Tr1 to Tr4 which have enhanced current drive performances in order to acquire an output signal with a sufficient amplitude, so that the currents flowing through the transfer lines L1 and L2 do not increase, and thus the consumed power of the output circuit is prevented from increasing.

Figure 5:
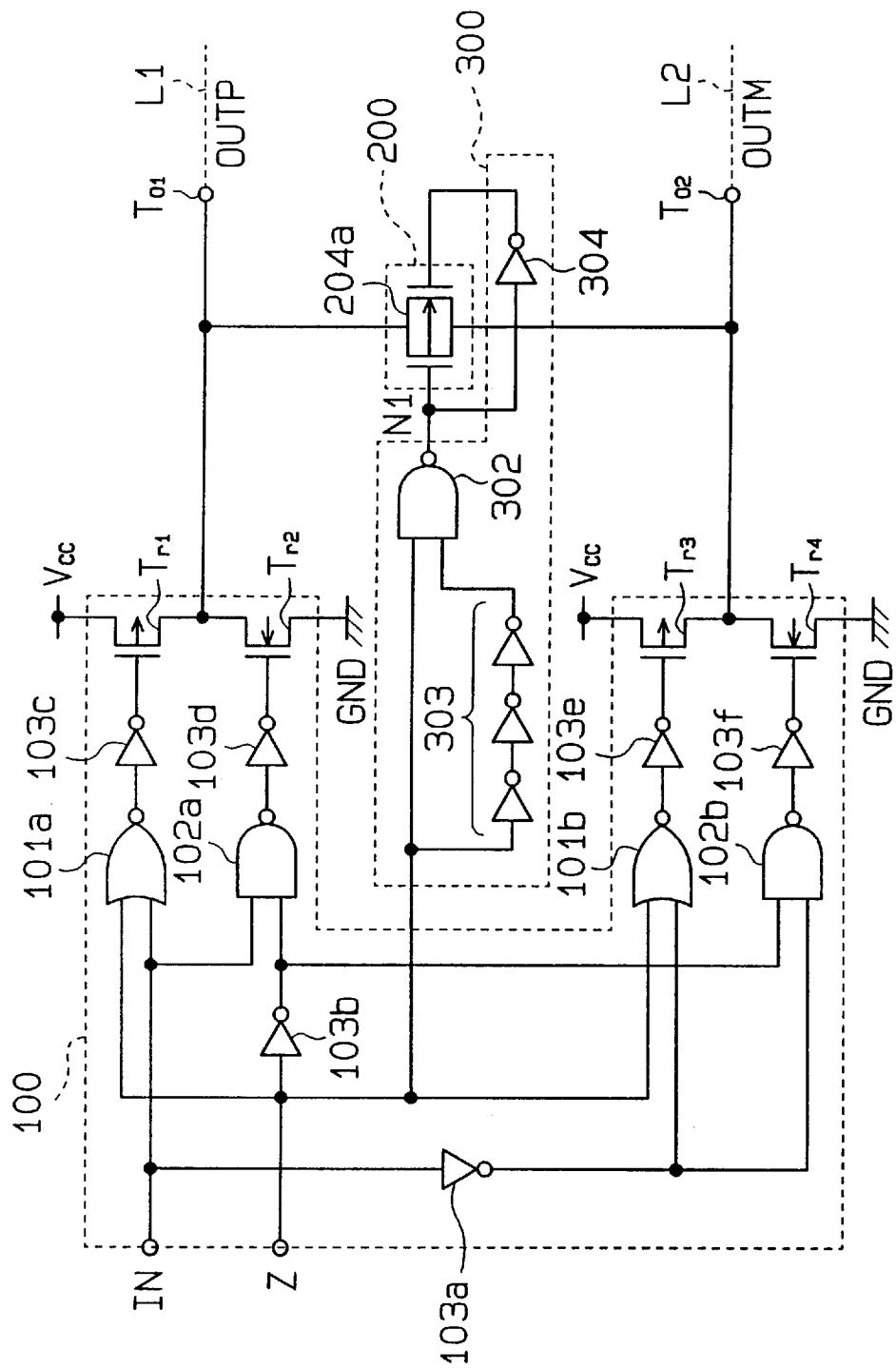
FIG. 5 is a circuit diagram illustrating an output circuit for a semiconductor device according to a second embodiment of the invention.

FIG. 5 is a circuit diagram illustrating an output circuit for a semiconductor device according to a second embodiment of the invention. In addition to the components of the first embodiment, the output circuit of the second embodiment further comprises a time limiter 300 for enabling the transfer gate 204a for a predetermined period of time. The time limiter 300 includes a NAND gate 302, odd number of stages of inverter circuits 303, and an inverter circuit 304.

The NAND gate 302 has a first input terminal for receiving the high-impedance setting signal Z, a second input terminal for receiving the high-impedance setting signal Z via the odd number of stages of inverter circuits 303, and an output terminal connected to the P-channel side gate of the transfer gate 204a. The inverter circuit 304 has an input terminal connected to a node N1 coupling together between the output terminal of the NAND gate 302 and the P-channel side gate of the transfer gate 204a, and an output terminal connected to the N-channel side gate of the transfer gate 204a.

Figure 8:
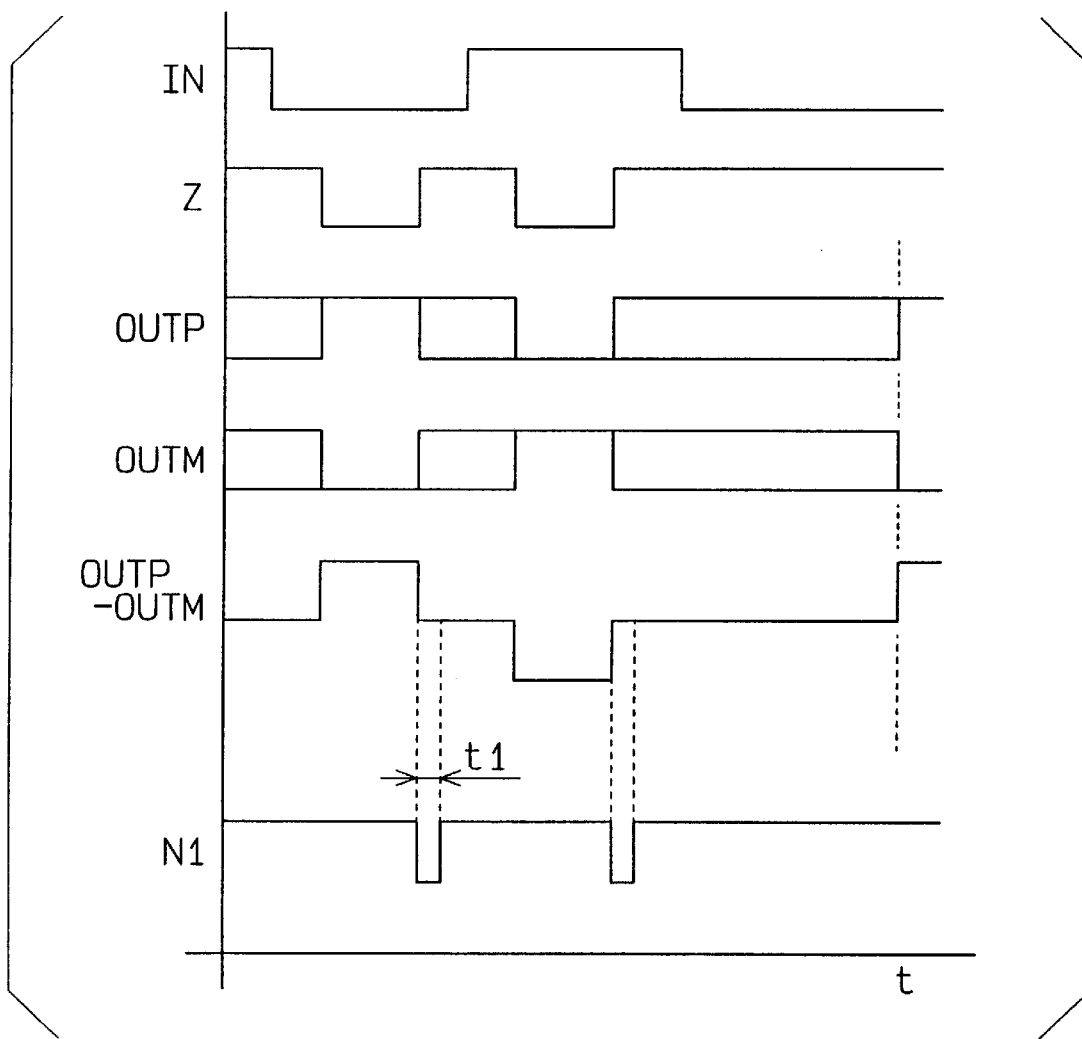
FIG. 8 is a waveform diagram showing the operation timing of the output circuit according to the second embodiment of the invention illustrated in FIG. 5.

In this output circuit, the NAND gate 302 supplies a H-level output signal to the transfer gate 204a in response to the L-level high-impedance setting signal Z, thus disabling the transfer gate 204a. As shown in FIG. 8, when the high-impedance setting signal Z goes to the H level from the L level, the L-level output signal is output from the NAND gate 302 (i.e., the node N1) for an operational delay time t1 in accordance with the delay stages provided by the inverter circuit 303. In response to the L-level output signal from the NAND gate 302 and its inverted H-level signal via the inverter circuit 304, the transfer gate 204a is enabled for the delay time t1, thus rendering the output terminals $T_{O1}$ and $T_{O2}$ in the short-circuited state for the delay time t1. The delay time t1 is set long enough to suppress the occurrence of noise on the transfer lines L1 and L2, but shorter than the duration of the high-impedance state. After the delay time t1 elapses, i.e., after the occurrence of noise is sufficiently suppressed, the transfer gate 204a is disabled. During the high-impedance state, therefore, the short-circuited state of the transfer lines L1 and L2 is maintained only during an initial portion of the high-impedance state sufficient to suppress noise. Hence, when a plurality of other output circuits are connected to the transfer lines L1 and L2, such constitution and operation of the operation of the transfer gate 204a does not affect those output circuits.

Figure 6:
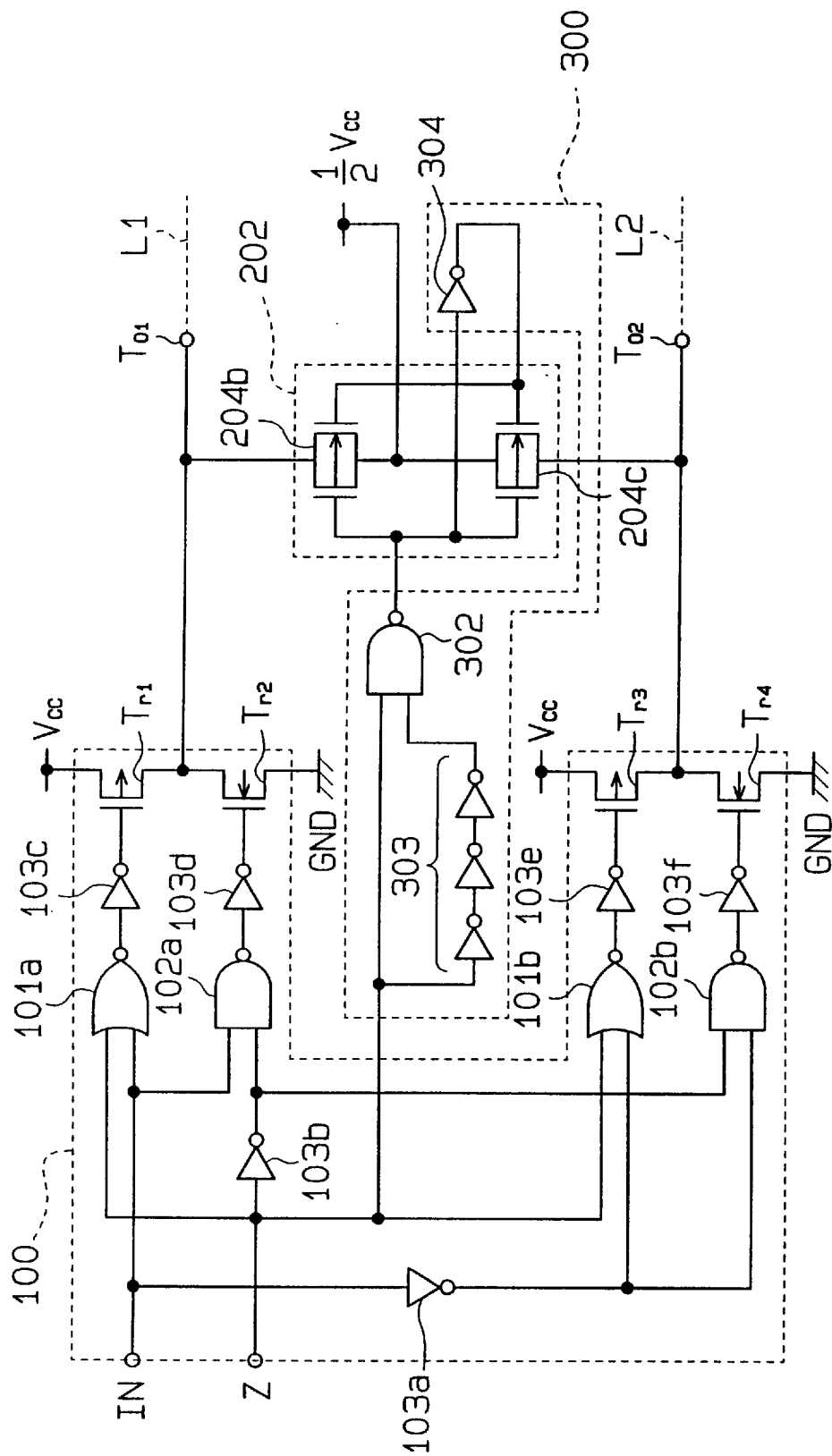
FIG. 6 is a circuit diagram illustrating an output circuit for a semiconductor device according to a third embodiment of the invention.

FIG. 6 is a circuit diagram illustrating an output circuit for a semiconductor device according to a third embodiment of the invention. The output circuit of the third embodiment has a switch circuit 202 comprised of two transfer gates 204b and 204c in place of the switch circuit 200 in the second embodiment.

The transfer gates 204b and 204c are connected in series between the output terminals $T_{O1}$ and $T_{O2}$. The transfer gate 204b has a P-channel side gate connected to the output terminal of the NAND gate 302 and the input terminal of the inverter circuit 304, and an N-channel side gate connected to the output terminal of the inverter circuit 304. The transfer gate 204c has a P-channel side gate connected to the output terminal of the NAND gate 302 and the input terminal of the inverter circuit 304, and an N-channel side gate connected to the output terminal of the inverter circuit 304. A supply voltage $V_{CC}/2$ having an intermediate level between the high-potential voltage supply $V_{CC}$ and the ground GND is supplied to the node between the transfer gates 204b and 204c.

In this output circuit, the NAND gate 302 sends a H-level output signal to the transfer gates 204b and 204c in response to the L-level high-impedance setting signal Z, disabling both transfer gates 204b and 204c. That is, the operation of the NAND gate 302 is substantially the same as those in the output circuits of the first and second embodiments.

When the high-impedance setting signal Z goes to the H level from the L level, the transfer gates 204b and 204c are enabled for a predetermined period of time by the operations of the inverter circuit 303 and the NAND gate 302. During the enable period for the transfer gates 204b and 204c, the voltage $V_{CC}/2$ is supplied to the output terminals $T_{O1}$ and $T_{O2}$. In other words, when the high-impedance setting signal Z goes to the H-level from the L-level, the output terminals $T_{O1}$ and $T_{O2}$ are forcibly reset to the level $V_{CC}/2$ for the delay time t1 after which the output terminals $T_{O1}$ and $T_{O2}$ are set in the high-impedance state. The reason for resetting the transfer lines L1 and L2 to the intermediate voltage level between the supply voltage $V_{CC}$ and the ground GND is to compensate for a possible variation in the current drive performance between the transistors Tr1 and Tr2 and the transistors Tr3 and Tr4.

Figure 7:
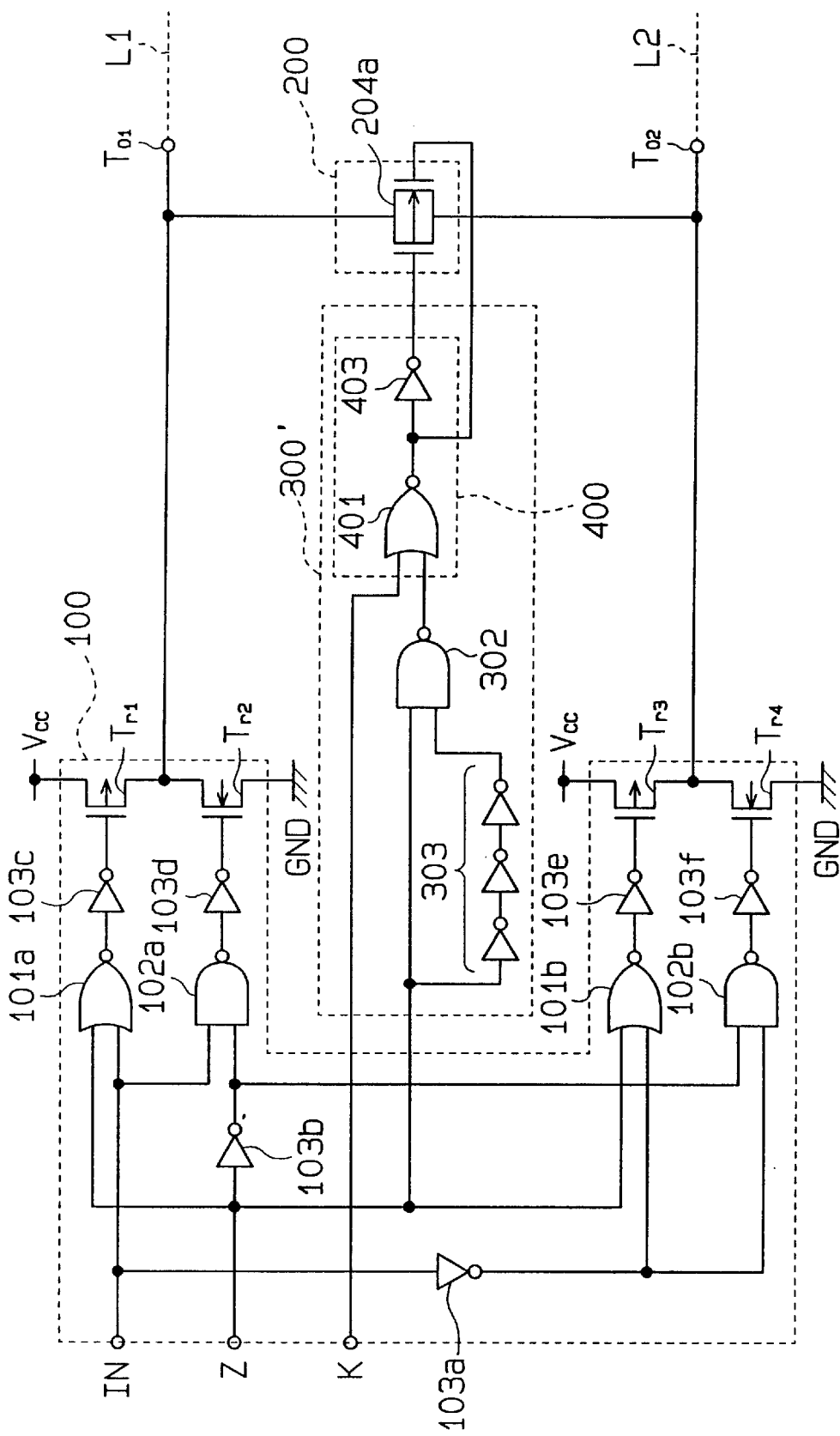
FIG. 7 is a circuit diagram illustrating an output circuit for a semiconductor device according to a fourth embodiment of the invention.

FIG. 7 is a circuit diagram illustrating an output circuit for a semiconductor device according to a fourth embodiment of the invention. The output circuit of the fourth embodiment has a time limiter 300' which (besides much of the circuitry of the time limiter 300) includes a circuit 400 for preventing the output terminals $T_{O1}$ and $T_{O2}$ from being short-circuited when a plurality of other output circuits connected to the same transfer lines L1 and L2 operate simultaneously. The circuit 400 will hereinafter be called "contention avoiding circuit". In comparison to the second embodiment, the contention avoiding circuit 400 is provided in place of the inverter circuit 304. The contention avoiding circuit 400 includes a NOR gate 401 and an inverter circuit 403.

The NOR gate 401 has a first input terminal connected to the output terminal of the NAND gate 302, a second input terminal for receiving a contention signal K indicating whether other output circuits are operating, and an output terminal connected to the input terminal of the inverter circuit 403. The output terminal of the inverter circuit 403 is connected to the P-channel side gate of the transfer gate 204a. The node between the output terminal of the NOR gate 401 and the input terminal of the inverter circuit 403 is connected to the N-channel side gate of the transfer gate 204a.

In this output circuit, the NOR gate 401 outputs a L-level output signal, regardless of the output signal of the NAND gate 302, in response to the H-level contention signal K indicating that other output circuits are operating. Consequently, the transfer gate 204a is disabled to prevent the short-circuiting of the output terminals $T_{01}$ and $T_{02}$. The contention avoiding circuit 400 prevents the output circuit from becoming a load on the other output circuits that are operating.

When the NAND gate 302 outputs a L-level pulse signal for a predetermined period of time in response to the rising of the A high-impedance setting signal Z, and when the contention signal K has a L level, the NOR gate 401 outputs a H-level pulse signal. The transfer gate 204a is enabled when the N-channel side gate receives the H-level pulse signal and the P-channel side gate receives the L-level pulse signal via the inverter circuit 403. In this case, the output circuit of the fourth embodiment performs substantially the same operation as the output circuit of the second embodiment.

Although only four embodiments of the present invention have been described herein, it should be apparent to those skilled in the art that the present invention may be embodied in many other specific forms without departing from the spirit or scope of the invention. Particularly, it should be understood that the invention may be embodied in the numerous ways. For example, each switch circuit may be comprised of a switching transistor, such as a N-channel MOS transistor or a P-channel MOS transistor, or another switching element, instead of a transfer gate.

Therefore, the present examples and embodiments are to be considered as illustrative and not restrictive and the invention is not to be limited to the details given herein, but may be modified within the scope and equivalence of the appended claims.

What is claimed is:

1. An output circuit comprising:

an output circuit section having a pair of output terminals for outputting complementary output signals in response to an input signal received by said output circuit section, said output circuit section setting said pair of output terminals in a high-impedance state in response to a high-impedance setting signal received by said output circuit section; and a switch circuit, connected between said pair of output terminals of said output circuit section, for permitting electric coupling between said pair of output terminals in response to said high-impedance setting signal.

2. The output circuit according to claim 1, further comprising a limiting circuit, connected to said switch circuit, for limiting a time during which said pair of output terminals are electrically coupled by said switch circuit in response to said high-impedance setting signal.

3. The output circuit according to claim 2, wherein said complementary output signals respectively have predetermined first and second voltage levels, and said switch circuit supplies a voltage of an approximately intermediate level between said first and second voltage levels to said pair of output terminals during the time when said pair of output terminals are electrically coupled by said switch circuit.

4. The output circuit according to claim 3, wherein said switch circuit includes at least one transfer gate.

5. The output circuit according to claim 2, wherein said switch circuit includes at least one transfer gate.

6. The output circuit according to claim 1, wherein said complementary output signals respectively have predetermined first and second voltage levels, and said switch circuit supplies a voltage of an approximately intermediate level between said first and second voltage levels to said pair of output terminals during the time when said pair of output terminals are electrically coupled by said switch circuit.

7. The output circuit according to claim 6, wherein said switch circuit includes at least one transfer gate.

8. The output circuit according to claim 1, wherein said output circuit is connected to a plurality of other output circuits via said pair of output terminals, and wherein said output circuit further comprises a circuit for disabling said switch circuit in response to a contention signal indicating that said other output circuits are operating, the contention signal being received by said disabling circuit.

9. The output circuit according to claim 8, further comprising a limiting circuit, connected to said switch circuit, for limiting a time during when said pair of output terminals are electrically coupled by said switch circuit in response to said high-impedance setting signal.

10. The output circuit according to claim 9, wherein said complementary output signals respectively have predetermined first and second voltage levels, and said switch circuit supplies a voltage of an approximately intermediate level between said first and second voltage levels to said pair of output terminals during the time when said pair of output terminals are electrically coupled by said switch circuit.

11. The output circuit according to claim 10, wherein said switch circuit includes at least one transfer gate.

12. The output circuit according to claim 9, wherein said switch circuit includes at least one transfer gate.

13. The output circuit according to claim 8, wherein said complementary output signals respectively have predetermined first and second voltage levels, and said switch circuit supplies a voltage of an approximately intermediate level between said first and second voltage levels to said pair of output terminals during the time when said pair of output terminals are electrically coupled by said switch circuit.

14. The output circuit according to claim 13, wherein said switch circuit includes at least one transfer gate.

15. The output circuit according to claim 1, wherein the electrical coupling provided by said switch circuit short-circuits said pair of output terminals.

16. The output circuit according to claim 1, wherein the electrical coupling provided by said switch circuit occurs only during an initial portion of the high-impedance state.

17. The output circuit according to claim 1, wherein the electrical coupling provided by said switch circuit occurs for a predetermined period of time of the high-impedance state.

* * * * *